United States Patent
Vladimirsky et al.

(10) Patent No.: US 8,681,313 B2
(45) Date of Patent: Mar. 25, 2014

(54) DIFFRACTION ELEMENTS FOR ALIGNMENT TARGETS

(75) Inventors: Yuli Vladimirsky, Weston, CT (US); Muhammad Arif, Ridgefield, CT (US); Robert Albert Tharaldsen, Sherman, CT (US)

(73) Assignee: ASML Holding N.V., Veldhoven (NL)

( * ) Notice: Subject to any disclaimer, the term of this patent is extended or adjusted under 35 U.S.C. 154(b) by 334 days.

(21) Appl. No.: 12/921,559

(22) PCT Filed: Apr. 3, 2009

(86) PCT No.: PCT/EP2009/002459
§ 371 (c)(1),
(2), (4) Date: Sep. 8, 2010

(87) PCT Pub. No.: WO2009/127331
PCT Pub. Date: Oct. 22, 2009

(65) Prior Publication Data
US 2011/0019173 A1 Jan. 27, 2011

Related U.S. Application Data

(60) Provisional application No. 61/045,108, filed on Apr. 15, 2008.

(51) Int. Cl.
| | | |
|---|---|---|
| *G01B 11/00* | (2006.01) | |
| *G01B 11/14* | (2006.01) | |
| *G02B 5/18* | (2006.01) | |
| *G03B 27/32* | (2006.01) | |
| *G03B 27/42* | (2006.01) | |
| *G03B 27/54* | (2006.01) | |
| *G03B 27/74* | (2006.01) | |

(52) U.S. Cl.
USPC ............. 355/68; 355/53; 355/67; 355/77; 356/399; 356/401; 356/615; 356/616; 399/576

(58) Field of Classification Search
USPC ............. 257/797; 355/53, 55, 66–68, 77; 356/399–401, 614–624; 359/566, 359/571–572, 576
See application file for complete search history.

(56) References Cited

U.S. PATENT DOCUMENTS 5,436,876 A * 7/1995 Yokoyama et al. ......... 369/44.12
2002/0186811 A1* 12/2002 Weiss et al. .................. 378/34
(Continued)

FOREIGN PATENT DOCUMENTS

| EP | 1 260 869 A1 | 11/2002 |
| EP | 1 400 860 A2 | 3/2004 |
| EP | 1 788 451 A1 | 5/2007 |

OTHER PUBLICATIONS

International Search Report mailed Aug. 26, 2009 for International Application No. PCT/EP2009/002459, 4 pgs.
(Continued)

*Primary Examiner* — Toan Ton
*Assistant Examiner* — Colin Kreutzer
(74) *Attorney, Agent, or Firm* — Sterne, Kessler, Goldstein & Fox P.L.L.C.

(57) ABSTRACT

A patterning device, including alignment targets having alignment features formed from a plurality of diffractive elements, each diffractive element including an absorber stack and a multi-layered reflector stack is provided. The diffractive elements are configured to enhance a pre-determined diffraction order used for pre-alignment and to diffract light in a pre-determined direction of a pre-alignment system when illuminated with light of a wavelength used for the pre-alignment. The diffractive elements may occupy at least half of an area of each alignment feature. The diffractive elements may be configured to enhance first or higher order diffractions, while substantially reducing zero$^{th}$ diffraction orders and specular reflection when illuminated with a wavelength used for reticle prealignment. The dimensions of each diffractive element may be a function of a diffraction grating period of each alignment feature.

13 Claims, 7 Drawing Sheets

(56) References Cited

U.S. PATENT DOCUMENTS

| | | |
|---|---|---|
| 2003/0180632 A1 | 9/2003 | Eurlings et al. |
| 2004/0145714 A1* | 7/2004 | Poultney .................... 355/55 |
| 2005/0275841 A1 | 12/2005 | Heerens et al. |
| 2007/0176128 A1 | 8/2007 | Van Bilsen et al. |
| 2007/0248898 A1 | 10/2007 | Rivoal |
| 2009/0027692 A1* | 1/2009 | Zwilling et al. .............. 356/617 |

OTHER PUBLICATIONS

International Preliminary Report on Patentability mailed Oct. 28, 2010 for International Application No. PCT/EP2009/002459, The International Bureau of WIPO, Geneva, Switzerland; 7 pgs.

* cited by examiner

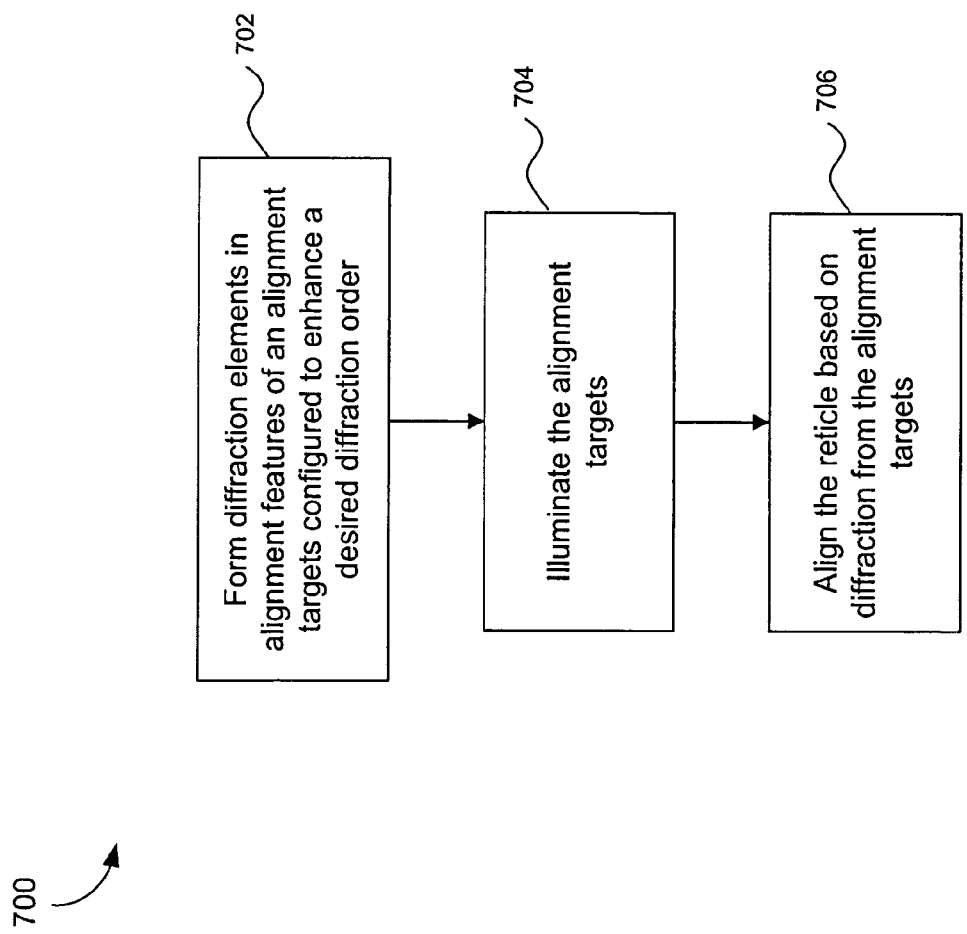

DIFFRACTION ELEMENTS FOR ALIGNMENT TARGETS

BACKGROUND

1. Field of the Invention

The present invention generally relates to diffraction elements for alignment targets.

2. Related Art

A lithographic apparatus is a machine that applies a desired pattern onto a substrate, usually onto a desired portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of about 5 nm-100 nm. Thus, EUV radiation sources may constitute a significant step toward achieving printing small features. Such radiation is termed extreme ultraviolet or soft x-ray, and possible sources include, for example, laser-produced plasma sources, discharge plasma sources, or synchrotron radiation from electron storage rings.

Alignment targets on reticles are used to align the reticles in a lithographic system. The alignment targets typically include profiled absorber stack with diffractive elements occupying at most one quarter of an area of alignment features on the alignment target. However, conventional alignment targets generate weak alignment signals resulting in insufficient reticle alignment accuracy.

SUMMARY

Methods, system and apparatus are needed to overcome the above described deficiencies.

According to one embodiment of the present invention, there is provided an alignment feature, including absorber stacks in an array and reflector stacks in an array coupled to corresponding absorber stacks. The absorber stacks and reflector stacks are configured to enhance a pre-determined diffraction order used for patterning device pre-alignment and to diffract light in a pre-determined direction of a pre-alignment system when illuminated with light of a wavelength used for reticle pre-alignment.

In an embodiment, the absorber and reflector stacks occupy at least half of an area of each alignment feature. The dimensions of each absorber and reflector stack pattern profiling are a function of a diffraction grating period of each alignment feature. The absorber and reflector stacks are configured to enhance first or higher order diffractions, while substantially reducing zero$^{th}$ diffraction orders and specular reflection when illuminated with a wavelength used for reticle pre-alignment.

Another embodiment of the present invention provides a method comprising the following steps. Forming an alignment target on the reticle, the alignment target having a plurality of alignment features, each alignment feature comprising diffractive elements configured to enhance a pre-determined diffraction order used for reticle pre-alignment. Illuminating the alignment target with a wavelength used for reticle alignment and using radiation diffracted from the alignment target to pre-align the reticle.

A further embodiment of the invention provides a lithographic apparatus comprising an illumination source configured to condition a radiation beam and a reflective patterning device, the reflective patterning device including alignment targets for aligning the patterning device with a mask table. Each of the alignment targets includes alignment features, each alignment feature having diffractive elements configured to enhance a particular diffraction order used for aligning the patterning device.

Further embodiments, features, and advantages of the present inventions, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIG. 7 illustrates a flowchart illustrating steps performed to pre-align a reticle, according to an embodiment of the invention.

Figure 1:
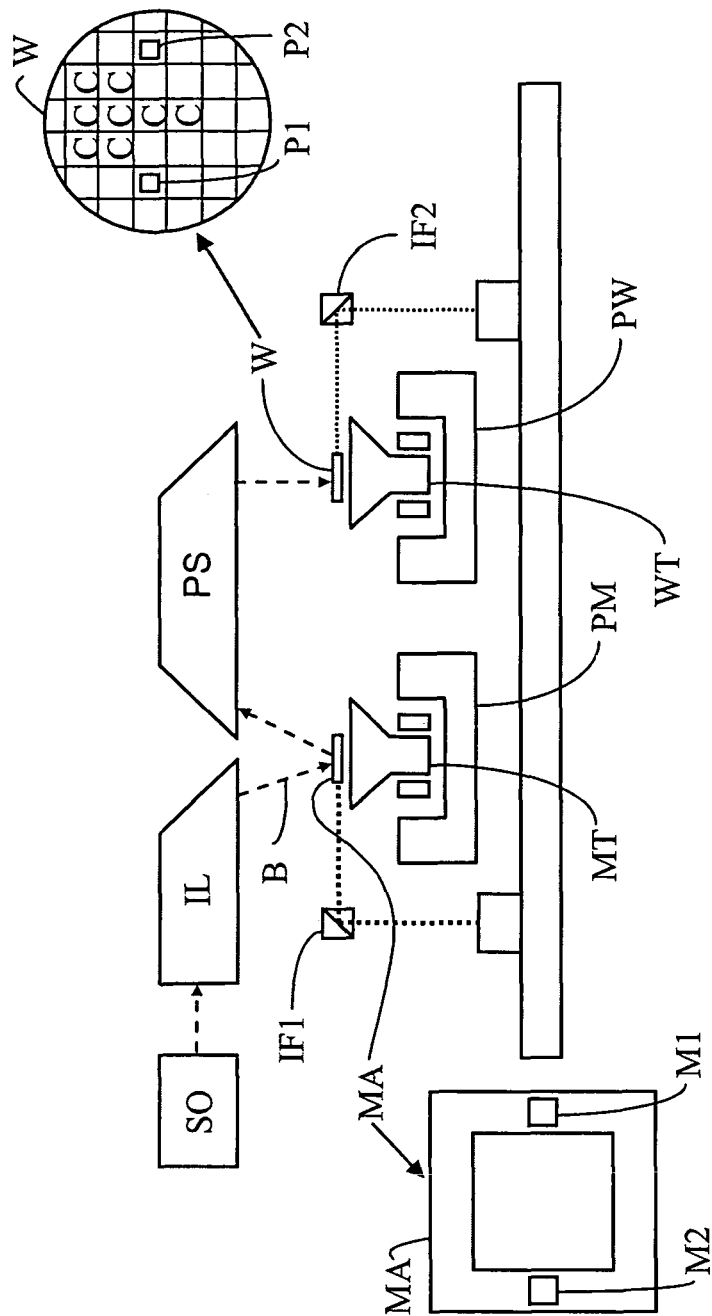
FIG. 1 depicts an exemplary lithographic apparatus.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus according to one embodiment of the invention. The apparatus comprises an illumination system (illuminator) IL configured to condition a radiation beam B (e.g., EUV radiation), a support structure (e.g., a mask table) MT constructed to support a patterning device (e.g., a mask or a reticle) MA and connected to a first positioner PM configured to accurately position the patterning device, a substrate table (e.g., a wafer table) WT constructed to hold a substrate (e.g., a resist coated wafer) W and connected to a second positioner PW configured to accurately position the substrate and a projection system (e.g., a reflective projection lens system) PS configured to project a pattern imparted to the radiation beam B by patterning device MA onto a target portion C (e.g., comprising one or more dies) of the substrate W.

The illumination system IL may include various types of optical components, including but not limited to refractive, reflective, magnetic, electromagnetic, electrostatic or other types of optical components, or any combination thereof, for directing, shaping, or controlling radiation.

The support structure WT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that cane be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. It may be desired to use a vacuum for EUV or electron beam radiation since other gases may absorb too much radiation or electrons. A vacuum environment may therefore be provided to the whole beam path with the aid of a vacuum wall and vacuum pumps.

As here depicted, the apparatus is of a reflective type (e.g., employing a reflective mask). Alternatively, the apparatus may be of a transmissive type (e.g., employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus, and the radiation beam is passed from the source SO to the illuminator IL with the aid of a beam delivery system (not shown) comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster (not shown) for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
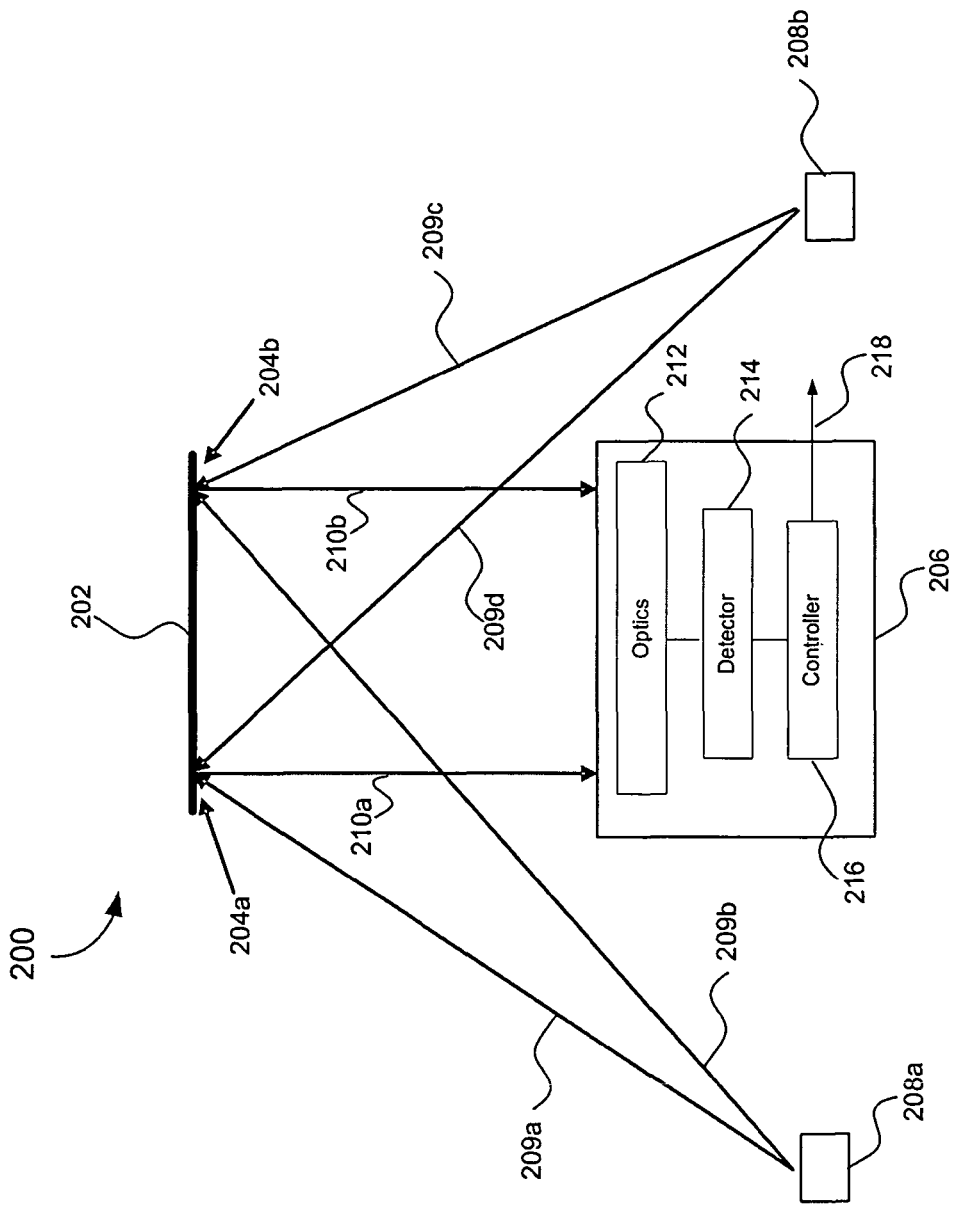
FIG. 2 illustrates a pre-alignment system configured to pre-align a reticle, according to an embodiment of the invention.

FIG. 2 illustrates a system 200 configured to pre-align a reticle 202, according to an embodiment of the invention. System 200 comprises illumination sources 208 (used interchangeably below as illumination sources and light sources) and pre-alignment system 206, which may include optics 212, an optional detector 214 and a controller 216.

Illumination sources 208 are configured to illuminate reticle 202 with light of a pre-determined wavelength used for reticle pre-alignment. In an embodiment, light generated by illumination sources 208 is in a near-infrared region of 650 nm to 1000 nm. In another embodiment, light of a wavelength of 880 nm is used. It is to be appreciated that the wavelength of light generated by illumination sources 208 for reticle alignment is a design choice, as understood by a skilled artisan. In the present embodiment, illumination source 208 comprises dual light sources 208a-b. In alternate embodiments, illumination source 208 may include a single light source or more than two light sources. It is to be appreciated that the number of light sources is a design choice, as understood by a skilled artisan. Illumination source 208 generates beams of radiation 209a-d, which are used to illuminate alignment targets 204a-b of reticle 202. Interaction of beams 209a-d with alignment targets 204 generates diffracted beams 210a-b, which are directed into pre-alignment system 206. Diffracted beams 210a-b are directed by optics 212 either onto optional detector 2214 or controller 216. Controller 216 generates a control signal 218, which is used to pre-align reticle 202 based on diffracted beams 210a-b.

In an embodiment, reticle 202 is a reflective patterning device used for Extreme Ultraviolet Lithography (EUV).

In an embodiment, reticle 202 is reticle MA and alignment targets 204a-b are alignment targets M1 and M2, as shown in FIG. 1.

Figure 3:
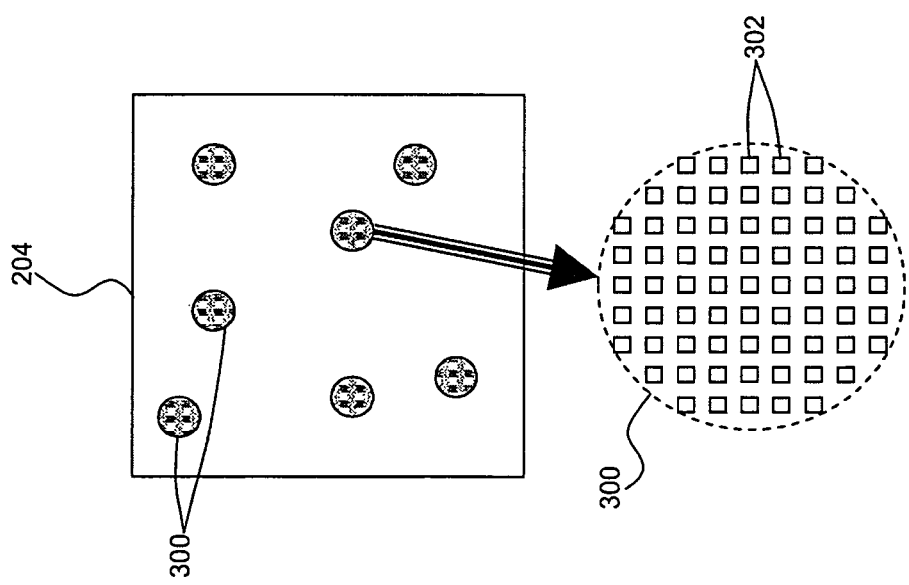
FIG. 3 illustrates an alignment target, according to an embodiment of the invention.

FIG. 3 illustrates an alignment target 204, according to an embodiment of the invention. Alignment target 204 comprises multiple alignment features 300 with each alignment feature 300 including multiple diffractive elements 302.

The alignment feature 300 may be used with the pre-alignment system 206 as an Alignment Mark Pattern. The pre-alignment system 206 may be configured to measure alignment of a reticle 202 on which the alignment targets 204 are located. In operation, the pre-alignment system 206 may image part of a target such as the alignment target 204 comprising alignment features 300. By analyzing the signal from the alignment features 300, the pre-alignment system 206 may measure the position of reticle 202.

Figure 4:
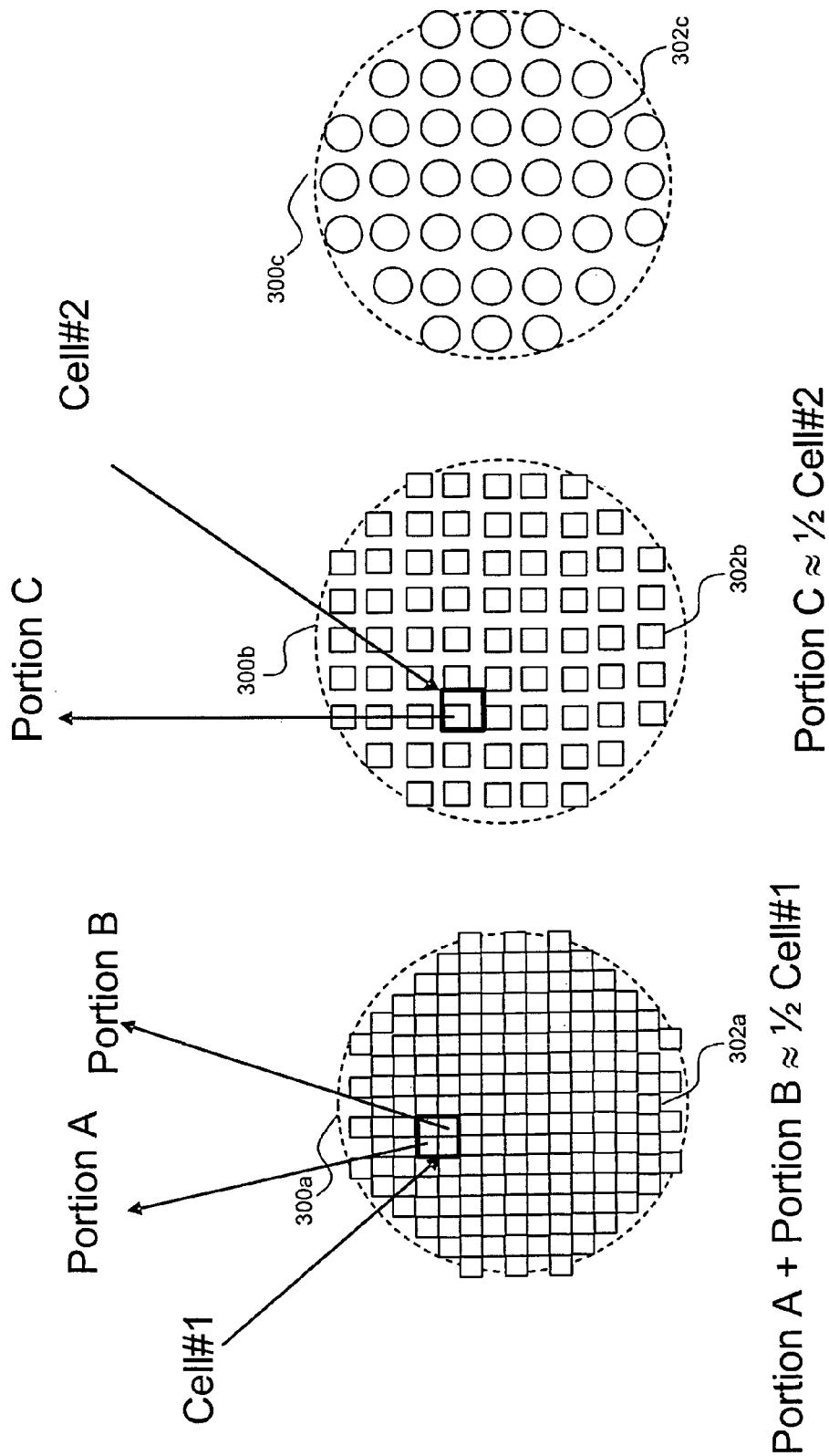
FIGS. 4A, 4B, and 4C illustrate exemplary alignment features including diffractive elements, according to various embodiments of the present invention.

In conventional alignment targets, diffractive elements do not occupy a substantial area of alignment features. As a result, when illuminated with light of a wavelength used for reticle alignment, alignment features fail to produce strong diffractions in a desired range required to align a reticle with a mask table. However, in embodiments presented herein, diffractive elements 302 within alignment features 300 occupy at least half of an area of each feature 300. Furthermore, in embodiments presented herein, diffractive elements 302 are configured to diffract incident light 209a-d in a pre-determined direction of pre-alignment system 206. Diffractive elements 302 are configured to enhance a predetermined diffraction order(s) that is used for reticle alignment, while reducing undesired diffraction order(s) and specular reflection. In an embodiment, diffractive elements 302 are configured to enhance first or higher diffraction orders, while suppressing zero$^{th}$ diffraction orders of incident light 209. In a further embodiment, diffractive elements 302 have a height that produces phase reversal of at least half the incident wavelength 209 used for reticle alignment. Diffractive elements 302 have dimensions that are a function of a diffraction grating period of alignment features 300. Example dimensions of diffractive elements 302 according to embodiments of the invention are described in further detail below with reference to FIG. 4.

FIGS. 4A, 4B, and 4C illustrate exemplary alignment features 300a-c including corresponding diffractive elements 302a-c, according to various embodiments of the present invention.

In the embodiment of FIG. 4A, alignment feature 300a includes a plurality of diffractive elements 302a arranged in a densely populated checkerboard pattern. In an embodiment, diffractive elements 302 are squares with each side of the square having a length of $$d/2,$$

where d is a diffraction grating period of alignment feature 300a.

In the embodiment of FIG. 4B, alignment feature 300b includes square shaped diffractive elements 302b, each square having sides of a length $$d/\sqrt{2},$$

where d is a diffraction grating period of alignment feature 300b.

In the embodiment of FIG. 4C, alignment feature 300c includes circular diffractive elements 302c of a radius $$d/\sqrt{2\pi},$$

where d is a diffraction grating period of alignment feature 302c.

According to an embodiment of the invention, diffractive elements 302a-c occupy at least half an area of each of alignment features 300a-c, respectively. The dense population of diffractive elements 302 is configured to enhance the predetermined diffractive order used to align reticle 202. For example, diffractive elements 302 are configured to enhance first or higher order diffractions, while substantially reducing zero$^{th}$ diffraction orders and specular reflection when illuminated with light beams 209.

In an embodiment, diffractive elements 302 are blazed and have a depth that produces phase reversal of half of wavelength 209 used for reticle alignment.

Additionally, or alternatively, diffractive elements 302 may be have arbitrary shapes, such as crosses, triangles, stars, letter H, letter U, etc. It is to be appreciated that the shape of diffractive elements 302 is a design choice, as understood to a skilled artisan.

Figure 5:
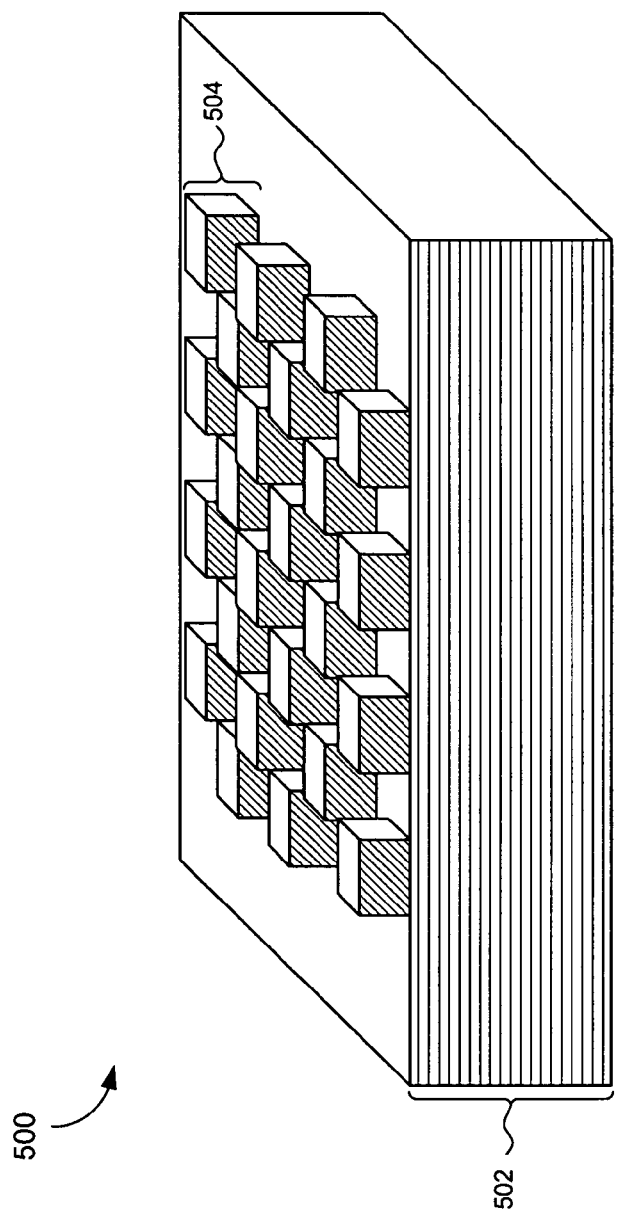
FIG. 5 illustrates a portion of an alignment feature.

FIG. 5 illustrates a portion 500 of an alignment feature. Portion 500 comprises a multilayer/reflector stack 502 and a plurality of absorber stacks 504. In this example, diffractive elements are absorber stacks 504. Absorber stacks 504 may have a depth of about 30-40 nm. Reflectivity of multilayer/reflector stack 502 is optimized for reflecting beam B from illuminator IL (see FIG. 1). For example, reflector stack 502 is optimized for reflecting actinic radiation of 13.5 nm wavelength. However, the reflectivity of multilayer stacks 502 and absorber stacks 504 for a wavelength region of alignment radiation 209. (see FIG. 2) used for alignment of reticle 202 (see FIG. 2) is approximately the same, and the resulting contrast may be insufficient for accurate reticle alignment. For example, only one fourth of an area of the alignment feature generates diffraction, which may result in a weak signal for reticle alignment.

Figure 6:
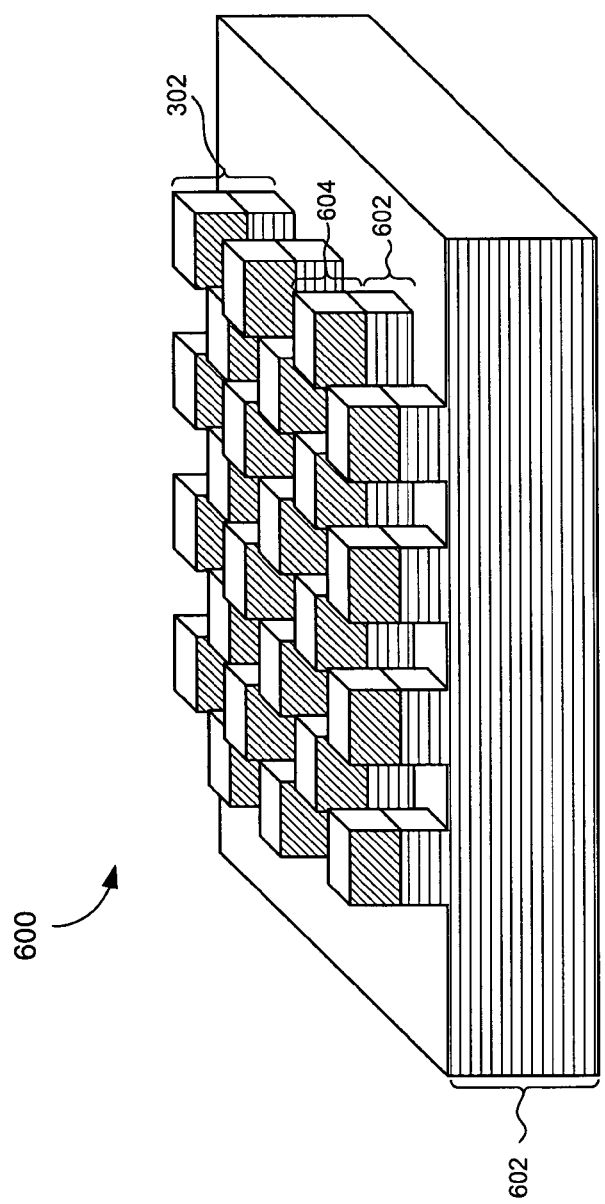
FIG. 6 illustrates a portion of an alignment feature, according to an embodiment of the invention.

As discussed above and below, embodiments presented herein remedy this deficiency of the embodiment of FIG. 5 by providing alignment features 300 having diffractive elements 302 configured to enhance predetermined diffraction orders, while suppressing undesired diffraction orders and specular reflection when illuminated with a predetermined wavelength used for reticle alignment. FIG. 6 illustrates diffractive elements 602, according to an embodiment of the invention.

FIG. 6 illustrates a portion 600 of alignment feature 300, according to an embodiment of the invention. In the present embodiment, each diffractive element 302 includes both an absorber stack 604 and a reflector/multilayer stack 602. In an embodiment, diffractive element 302 is about 80 nm high. It is to be appreciated that the height of the diffractive element 302 is a design choice, as would be understood by a skilled artisan.

In one embodiment, the alignment feature 300 having an area may comprise first profiles in an array on a first layer and second profiles in an array on a second layer such that the first and second layers form a phase grating. Each of the first profiles and second profiles may occupy at least half of the area of an alignment feature 300. In one embodiment, the first and second layers may comprise the same material. In another embodiment, the first and second layers may comprise a different material. In other embodiments, the first layer may comprise a multilayer stack and the second array may comprise a multilayer stack. Alternatively, both the first and second layers may comprise multilayer stacks. As shown in FIG. 4a, a Cell #1 includes a portion A area and a portion B area, each defining the first profiles in one embodiment of the present invention. The remaining area of the Cell #1, i.e., the area without the portion A area and portion B area defines the second profiles in one embodiment of the present invention. Area A and area B comprise at least half the area of Cell#1. According to one embodiment, for a given height of the first profiles, total region of the first profiles relative to the second profiles can be proportionately determined on a Cell basis based on a desired increase or a level of signal that can be obtained from the alignment feature 300 when illuminated with light of a wavelength used for reticle pre-alignment. For example, if the relative height difference between the first and second profiles is 40-50 nm, for 880 nm light, the area of the first profiles can be at least half of the area of the alignment feature 300. That is, the area of the first profiles relative to the area of the second profiles can be adjusted based on a signal level desired from the alignment feature 300 for a given height of the first profiles. Likewise, a Cell #2 in FIG. 4b illustrates other examples of the first and second profiles. Portion C comprises at least half the area of Cell #2. Examples of the materials used to create alignment features 300 include materials used in EUV reticles. In one example, the first layer may be absorber stacks 604 (see FIG. 6) and the second layer may be multilayer/reflector stacks 602 (see FIG. 6). Examples of a pattern of the absorber stacks 604 on multilayer/reflector stacks 602 include the absorber stacks 604 that comprise a clear EUV absorber layer. Likewise, multilayer/reflector stacks 602 may comprise a molybdenum/silicon dielectric stack for reflection and the absorber stacks 604 may comprise tanatalum nitride for absorption.

In one example, diffractive elements 302 are formed by etching into multilayer stack 602 so as to enhance a predetermined diffraction order that is to be used for reticle alignment.

In an embodiment, a first order diffraction is used for reticle alignment.

In an embodiment, diffractive elements 302 have a height that produces phase reversal of half the incident wavelength used for reticle alignment.

In an alternate embodiment, a surface of diffractive elements 302 is blazed to enhance the predetermined diffraction order that is used for reticle alignment. Blazing may comprise angling a diffractive element 302 or surface of a diffractive element 302 to enhance a pre-determined diffraction order in the direction of pre-alignment system 206 when illuminated with a pre-determined wavelength used for reticle pre-alignment.

FIG. 7 illustrates a flowchart 700 illustrating blocks performed to pre-align a reticle, according to an embodiment of the invention. Flowchart 700 will be described with continued reference to the example operating environment depicted in FIG. 2. However, the blocks performed in flowchart 700 are not limited to that embodiment. Note that some of the blocks shown in flowchart 700 do not necessarily have to occur in the order shown.

In block 702, a plurality of alignment targets are formed on a reticle. Each alignment target has multiple alignment features, and each alignment feature includes multiple diffractive elements configured to enhance a pre-determined diffraction order that is used to perform reticle pre-alignment. For example, alignment targets 204 are formed on reticle 202 with each alignment target 204 comprising multiple alignment features 300, each alignment feature 300 including multiple diffractive elements 302, which are configured to enhance a predetermined diffraction order used to perform reticle pre-alignment.

In block 704, the alignment targets are illuminated with a beam of radiation having a wavelength used for reticle alignment. For example, illumination sources 208 are used to illuminate targets 204 of reticle 202 with beams 209 having a wavelength used to perform reticle pre-alignment.

In block 706, diffracted beams from the alignment targets are used to perform reticle pre-alignment. For example, alignment optics 212 direct diffracted beams 210 to controller 216, which produces a signal 218 used to pre-align reticle 202.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus for use with a reflective patterning device, the lithographic apparatus comprising:

an illumination source configured to condition a radiation beam; and a support configured to hold the reflective patterning device, wherein the reflective patterning device includes a plurality of alignment features, wherein the plurality of alignment features have diffractive elements that include absorber stacks in an array, and multi-layered reflector stacks in an array coupled to corresponding absorber stacks, and wherein a pattern and a geometry of the absorber stacks and multi-layered reflector stacks are configured to enhance a pre-determined diffraction order used for reflective patterning device pre-alignment.

2. The lithographic apparatus of claim 1, wherein the diffractive elements are arranged in a checkerboard pattern within each alignment feature.

3. The lithographic apparatus of claim 1, wherein the diffractive elements have dimensions that are a function of a diffraction grating period of the alignment features.

4. The lithographic apparatus of claim 1, wherein the diffractive elements are a plurality of squares with each square having sides of a dimension $$d/\sqrt{2},$$

wherein d is a diffraction grating period of the alignment feature.

5. The lithographic apparatus of claim 1, wherein the diffractive elements are a plurality of circles with a radius of $$d/\sqrt{(2\pi)},$$

wherein d is a diffraction grating period of the alignment feature.

6. The lithographic apparatus of claim 1, wherein the diffractive elements have a height configured to produce Phase reversal of half the incident wavelength used for pre-alignment of the patterning device.

7. The lithographic apparatus of claim 1, wherein a surface of the diffractive elements is blazed to enhance the predetermined diffraction order used for the reflective patterning device pre-alignment.

8. The lithographic apparatus of claim 1, wherein each of the plurality of alignment features having an area, the each of the plurality of alignment features comprising:

first profiles in an array on a first layer; and second profiles in an array on a second layer, such that the first and second layers form a phase grating, wherein the first profiles occupy at least half of the area of the alignment feature.

9. The lithographic apparatus of claim 8, wherein the first and second layers comprise a same material.

10. The lithographic apparatus of claim 1, wherein the absorber stacks and multi-layered reflector stacks are configured to diffract light in a pre-determined direction of a pre-alignment system if illuminated with light of a wavelength used for pre-alignment of the reflective patterning device.

11. The lithographic apparatus of claim 1, wherein the absorber stacks and the multi-layered reflector stacks occupy at least half of an area of the alignment feature.

12. The lithographic apparatus of claim 1, wherein the absorber stacks and the multi-layered reflector stacks are configured to enhance first or higher order diffractions, while substantially reducing zero$^{th}$ diffraction orders and specular reflection if illuminated with the wavelength used for pre-alignment of the reflective patterning device.

13. The lithographic apparatus of claim 1 wherein the absorber stacks and the multi-layered reflector stacks are squares with each square having sides of a dimension d/2, wherein d is a diffraction grating period of the alignment feature.

* * * * *